United States Patent
Chang et al.

(10) Patent No.: US 10,649,339 B2
(45) Date of Patent: May 12, 2020

(54) RESIST MATERIAL AND METHOD FOR FORMING SEMICONDUCTOR STRUCTURE USING RESIST LAYER

(71) Applicant: Taiwan Semiconductor Manufacturing Co., Ltd., Hsinchu (TW)

(72) Inventors: Ya-Ching Chang, Hsinchu (TW); Chen-Yu Liu, Kaohsiung (TW); Cheng-Han Wu, Taichung (TW); Ching-Yu Chang, Yuansun Village (TW); Chin-Hsiang Lin, Hsinchu (TW)

(73) Assignee: TAIWAN SEMICONDUCTOR MANUFACTURING CO., LTD., Hsnichu (TW)

( * ) Notice: Subject to any disclaimer, the term of this patent is extended or adjusted under 35 U.S.C. 154(b) by 0 days.

(21) Appl. No.: 15/482,315

(22) Filed: Apr. 7, 2017

(65) Prior Publication Data
US 2018/0164684 A1   Jun. 14, 2018

Related U.S. Application Data

(60) Provisional application No. 62/433,560, filed on Dec. 13, 2016.

(51) Int. Cl.
*G03F 7/20* (2006.01)
*G03F 7/039* (2006.01)
(Continued)

(52) U.S. Cl.
CPC .............. *G03F 7/38* (2013.01); *G03F 7/0392* (2013.01); *G03F 7/16* (2013.01); *G03F 7/20* (2013.01);
(Continued)

(58) Field of Classification Search
CPC ...... G03F 7/038; G03F 7/2059; G03F 7/2004; G03F 7/0397; G03F 7/0045;
(Continued)

(56) References Cited

U.S. PATENT DOCUMENTS 3,573,301 A * 3/1971 Winter ............... C08G 18/3851
521/167
4,476,215 A * 10/1984 Kausch .................... G03F 7/027
430/281.1

(Continued)

FOREIGN PATENT DOCUMENTS

EP         1 903 394 B1     4/2015
JP      2011-141495    *   7/2011   ............. G03F 7/004
(Continued)

OTHER PUBLICATIONS

Machine translation of JP 2011-141495 (2011).*
Machine translation og JP 2012-252080 (2012).*
Machine translation of JP 2012-242556 (2012).*

*Primary Examiner* — Martin J Angebranndt
(74) *Attorney, Agent, or Firm* — Birch, Stewart, Kolasch & Birch, LLP

(57) ABSTRACT

A resist material and methods for forming a semiconductor structure including using the resist material are provided. The method for forming a semiconductor structure includes forming a resist layer over a substrate and exposing a portion of the resist layer to form an exposed portion of the resist layer by performing an exposure process. The method for forming a semiconductor structure further includes developing the resist layer in a developer. In addition, the resist layer is made of a resist material including a photosensitive polymer and a contrast promoter, and a protected functional group of the photosensitive polymer is deprotected to form a deprotected functional group during the exposure process, (Continued)

and a functional group of the contrast promoter bonds to the deprotected functional group of the photosensitive polymer.

20 Claims, 6 Drawing Sheets

(51) Int. Cl.
 G03F 7/32 (2006.01)
 G03F 7/16 (2006.01)
 G03F 7/38 (2006.01)
(52) U.S. Cl.
 CPC .............. G03F 7/2004 (2013.01); G03F 7/32 (2013.01); G03F 7/325 (2013.01)
(58) Field of Classification Search
 CPC .... G03F 7/0046; G03F 7/0382; G03F 7/0388; G03F 7/0392; G03F 7/325; G03F 7/091; G03F 7/039; G03F 7/16; G03F 7/38; G03F 7/11; G03F 7/09; G03F 7/20; G03F 7/32; H01L 21/027; H01L 21/308
 See application file for complete search history.

(56) References Cited

U.S. PATENT DOCUMENTS

| | | | | |
|---|---|---|---|---|
| 5,942,367 | A * | 8/1999 | Watanabe | G03F 7/0045 430/170 |
| 5,985,512 | A * | 11/1999 | Hatakeyama | G03F 7/0045 430/270.1 |
| 6,117,621 | A * | 9/2000 | Hatakeyama | G03F 7/0045 430/270.1 |
| 6,686,124 | B1 * | 2/2004 | Angelopoulos | G03C 1/733 430/270.1 |
| 6,824,951 | B2 * | 11/2004 | Lee | G03F 7/0392 430/270.1 |
| 8,796,666 | B1 | 8/2014 | Huang et al. | |
| 9,012,132 | B2 | 4/2015 | Chang | |
| 9,028,915 | B2 | 5/2015 | Chang et al. | |
| 9,093,530 | B2 | 7/2015 | Huang et al. | |
| 9,146,469 | B2 | 9/2015 | Liu et al. | |
| 9,213,234 | B2 | 12/2015 | Chang | |
| 9,223,220 | B2 | 12/2015 | Chang | |
| 9,256,133 | B2 | 2/2016 | Chang | |
| 9,536,759 | B2 | 1/2017 | Yang et al. | |
| 9,548,303 | B2 | 1/2017 | Lee et al. | |
| 2004/0033441 | A1 * | 2/2004 | Yasunami | G03F 7/0382 430/270.1 |
| 2007/0148589 | A1 | 6/2007 | Kanda et al. | |
| 2009/0226843 | A1 * | 9/2009 | Hatakeyama | G03F 7/0397 430/286.1 |
| 2010/0297563 | A1 * | 11/2010 | Watanabe | G03F 7/0035 430/325 |
| 2011/0165521 | A1 * | 7/2011 | Hata | G03F 7/0035 430/325 |
| 2011/0287234 | A1 * | 11/2011 | Tsuchihashi | G03F 7/0382 428/195.1 |
| 2012/0214100 | A1 * | 8/2012 | Kobayashi | G03F 7/0045 430/285.1 |
| 2013/0280656 | A1 * | 10/2013 | Lowes | G03F 7/091 430/280.1 |
| 2014/0030640 | A1 * | 1/2014 | Tsuchihashi | C08F 8/14 430/5 |
| 2014/0072915 | A1 * | 3/2014 | Chen | G03F 7/0397 430/325 |
| 2014/0273521 | A1 * | 9/2014 | Wu | H01L 21/0274 438/781 |
| 2016/0005641 | A1 * | 1/2016 | Sim | H01L 21/76224 438/438 |
| 2016/0147154 | A1 * | 5/2016 | Takizawa | G03F 7/038 428/195.1 |
| 2016/0147155 | A1 * | 5/2016 | Takizawa | G03F 7/038 428/195.1 |

FOREIGN PATENT DOCUMENTS

| | | | |
|---|---|---|---|
| JP | 2012-242556 | * 12/2012 | ............ G03F 7/038 |
| JP | 2012-252080 | * 12/2012 | |

* cited by examiner

RESIST MATERIAL AND METHOD FOR FORMING SEMICONDUCTOR STRUCTURE USING RESIST LAYER

PRIORITY CLAIM AND CROSS-REFERENCE

This Application claims the benefit of U.S. Provisional Application No. 62/433,560, filed on Dec. 13, 2016, and entitled "Resist material with contrast promoter", the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

One of the important drivers for increased performance in a semiconductor structure is the higher level of integration of circuits. This is accomplished by miniaturizing or shrinking device sizes on a given chip. However, as the device sizes shrink, lithography processes used to form the devices also become more and more challenging.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
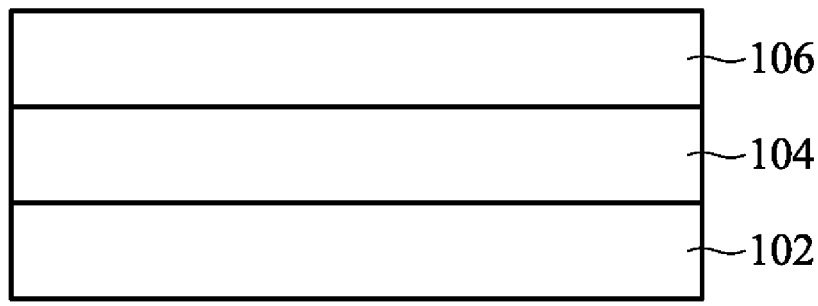
FIGS. 1A to 1E show cross-sectional representations of various stages of forming a semiconductor structure including performing an extreme ultraviolet (EUV) lithography process in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Embodiments of resist materials used in lithography processes and methods for forming semiconductor structures using the resist materials are provided. The resist material may be used to form a resist layer and a pattern may be formed in the resist layer by performing an exposure process and a developing process. In addition, the resist material may include contrast promoters which are configured to improve the contrast of the resulting pattern in the resist layer by reducing the loss of unwanted resist material during the developing process.

FIGS. 1A to 1E show cross-sectional representations of various stages of forming a semiconductor structure 100 including performing an extreme ultraviolet (EUV) lithography process in accordance with some embodiments. As shown in FIG. 1A, a substrate 102 is received in accordance with some embodiments. The substrate 102 may be a semiconductor wafer such as a silicon wafer. Alternatively or additionally, the substrate 102 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and diamond. Examples of the compound semiconductor materials may include, but are not limited to, silicon carbide, gallium arsenic, gallium phosphide, indium phosphide, indium arsenide, and indium antimonide. Examples of the alloy semiconductor materials may include, but are not limited to, SiGe, GaAsP, AlInAs, AlGaAs, GaInAs, GaInP, and GaInAsP.

In some embodiments, the substrate 102 includes structures such as doped regions including wells and source/drain regions, isolation features including shallow trench isolation (STI), inter-level dielectric (ILD) layers, and/or conductive features including gate electrodes, metal lines, vias, and contacts.

A material layer 104 is formed over the substrate 102, as shown in FIG. 1A in accordance with some embodiments. The material layer 104 is configured to be patterned in subsequent manufacturing processes. The material layer 104 may be one or more material layers. In some embodiments, the material layer 104 includes a silicon layer, a dielectric layer, and/or a doped poly-silicon layer.

After the material layer 104 is formed, a resist layer 106 is formed over the material layer 104, as shown in FIG. 1A in accordance with some embodiments. In some embodiments, the resist layer 106 is a positive photoresist layer. In some embodiments, the resist layer 106 is a positive photoresist layer used with a negative tone developer. In some embodiments, when a portion of the resist layer 106 exposed to radiation (e.g. light), the exposed portion will become insoluble or less soluble in a developer, while an unexposed portion of the resist layer 106 will remain soluble in the developer.

In some embodiments, the resist layer 106 is formed by coating a resist material over the material layer 104. The resist material may include photosensitive polymers and contrast promoters to have an improved contrast when forming a pattern. Details of the resist material used to form the resist layer will be described in more details afterwards.

Figure 1B:
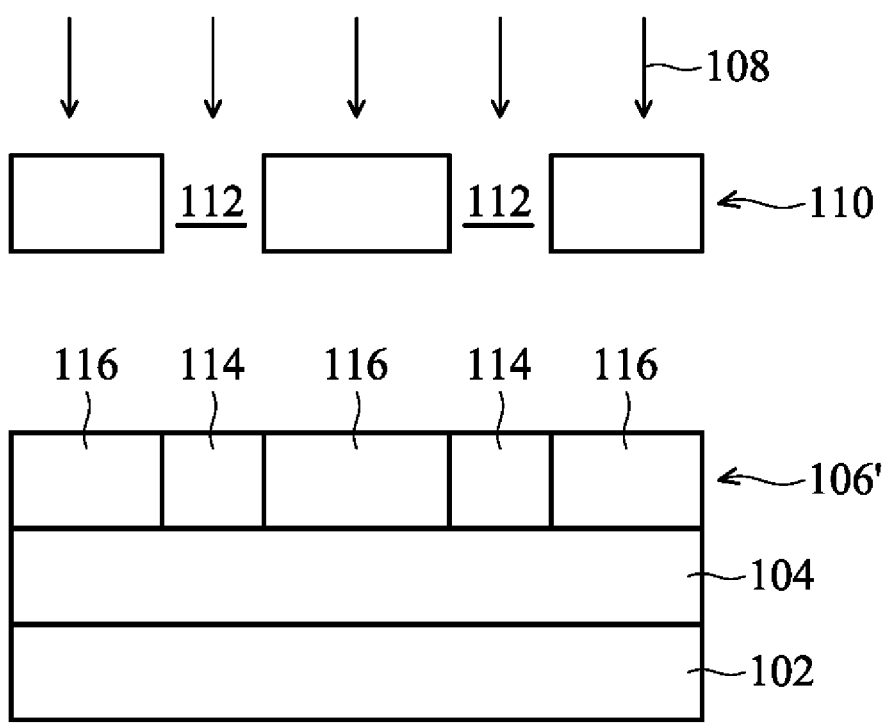

After the resist layer 106 is formed, an exposure process 108 is performed onto the resist layer 106 to form a patterned resist layer 106', as shown in FIG. 1B in accordance with some embodiments. More specifically, a mask structure 110 with openings 112 is positioned over the resist layer 106 during the exposure process 110, so that some portions of the resist layer 106 are exposed by the openings 112 of the mask structure 110, and the patterned resist layer 106' therefore has exposed portions 114 and unexposed portions 116. The exposed portions 114 are exposed to the radiation (e.g. light) during the exposure process 108. In some embodiments, the exposed portions 114 are converted to being insoluble or less soluble to a developer used afterwards than the unexposed portions 116.

In some embodiments, the patterned resist layer 106' is heated after the exposure process 108 is performed. As described previously, the resist layer 106 may include photosensitive polymers and contrast promoters which are configured to improve the pattern contrast during the developing process performed afterwards, and the heating may help the contrast promoters in the exposed portions 114 of the patterned resist layer 106' to improve. In addition, the heating of the patterned resist layer 106' may also help to dry the patterned resist layer 106'.

Figure 1C:
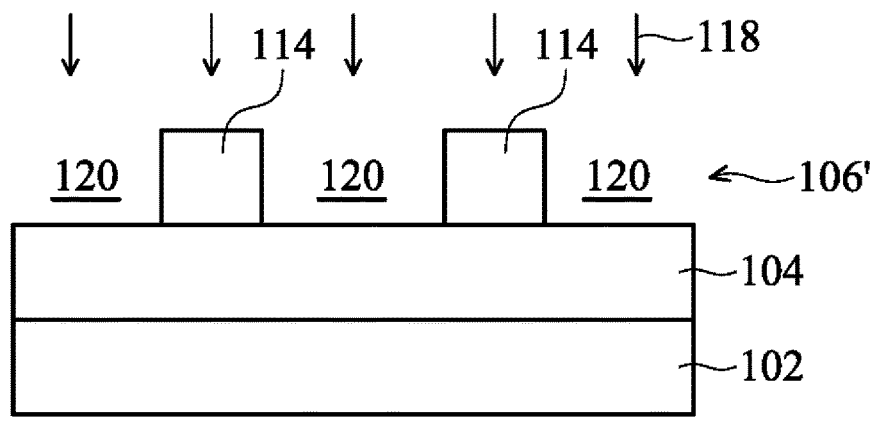

Next, a developing process 118 is performed on the patterned resist layer 106' to form openings 120, as shown in FIG. 1C in accordance with some embodiments. The unexposed portions 116 of the patterned resist layer 106' are dissolved in a developer used in the developing process 118 and are removed with the developer. As described previously, the contrast promoters in the exposed portions 114 of the patterned resist layer 106' may help reduce the amount of the exposed portion 114 dissolving in the developer during the developing process 118 (Details will be described later).

In some embodiments, the developer is a negative tone developer used in a EUV process. In some embodiments, the developer is an organic solvent. In some embodiments, the developer is made of an organic compound having less than 15 carbons. In some embodiments, the developer includes compounds having ester groups and/or ketone groups. In some embodiments, the developer includes 2-heptanone, n-butyl acetate, isoamyl acetate, cyclohexanone, 2-heptanone, 5-methyl-2-hexanone, methyl-2-hydroxyisobutyrate, ethyl lactate or propylene glycol monomethyl ether acetate, n-pentyl acetate, n-butyl propionate, n-hexyl acetate, n-butyl butyrate, isobutyl butyrate, 2,5-dimethyl-4-hexanone, 2,6-dimethyl-4-heptanone, propyl isobutyrate, isobutyl propionate, or combinations thereof.

Figure 1D:
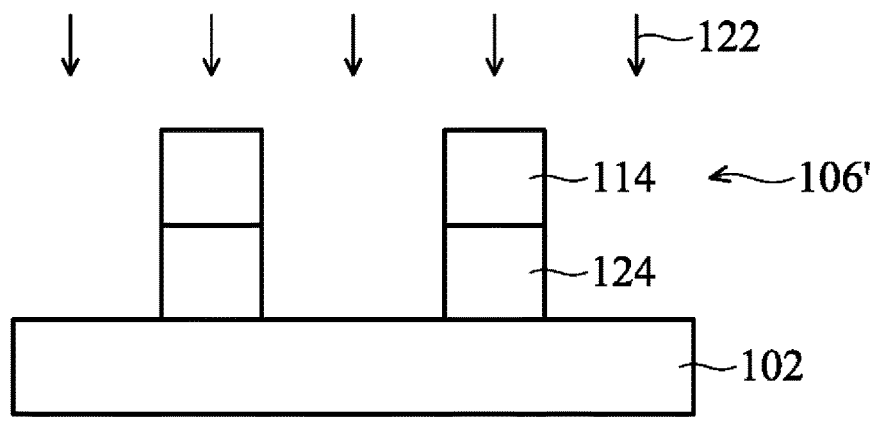

As shown in FIG. 1C, after the developing process 118 is performed, unexposed portions 116 are removed by the developer to form the openings 120 while the exposed portions 114 are left on the material layer 104 in accordance with some embodiments. Afterwards, an etching process 122 is performed to etch the material layer 104 through the openings 120, as shown in FIG. 1D in accordance with some embodiments.

Figure 1E:
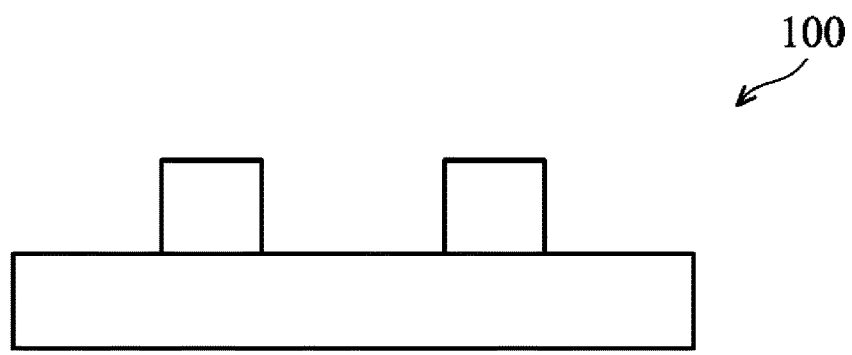

In some embodiments, the etching process 122 is a dry etching process, such as a plasma etching process. After the etching process 122 is performed, portions 124 of the etched material layer 104' located under the exposed portions 114 of the patterned resist layer 106' are left on the substrate 102, while the portions originally located under the unexposed portions 116 are removed. Next, the exposed portions 114 of the patterned resist layer 106' are removed to form the semiconductor structure 100, as shown in FIG. 1E in accordance with some embodiments.

As described previously, the resist material used to form the resist layer 106 may include photosensitive polymers and contrast promoters, so that the contrast between the exposed portions 114 and the unexposed portions 116 after performing the developing process 118 may be improved. It should be noted that, although the patterned resist layer 106' is used as a mask for etching the material layer 104, the scope of the disclosure is not intended to be limiting. That is, the patterned resist layer 106' may be used as a mask in various manufacturing processes, such as an implanting process.

The resist material which may be used to form the resist layer 106 may have the composition described below.

The resist material includes photosensitive polymers in accordance with some embodiments. The photosensitive polymers may be soluble in a developer used in a developing process (e.g. the developing process 118) but become less soluble or insoluble in the developer after being exposed (e.g. in the exposure process 108). In some embodiments, the weight average molecular weight of the photosensitive polymer is less than about 1000.

In some embodiments, the photosensitive polymer includes photosensitive functional groups bonding to a main chain of the photosensitive polymer. The photosensitive functional groups may tend to release electrons when they are exposed to radiation (e.g. light). In some embodiments, the photosensitive functional groups include polyhydroxystyrene moiety.

In some embodiments, the photosensitive polymer further includes protected functional groups bonding to the main chain of the photosensitive polymer. In some embodiments, the protected functional groups are acid labile functional groups which tend to be deprotected and convert to deprotected functional groups in an acidic condition.

In some embodiments, the protected functional groups convert to a —COOH groups in an acidic condition. More specifically, a protection group may bond to the —COOH group on the main chain of the photosensitive polymer, and the protection group tends to be released in an acidic environment and therefore the —COOH group on the main chain become unprotected in the acidic environment.

The deprotected functional groups (e.g. —COOH group) bonding to the main chain of the photosensitive polymer will make the photosensitive polymer become less soluble or become insoluble in the developer (e.g. the developer used in the developing process 118 shown in FIG. 1C). The protected functional groups may be any protection groups that are able to bond to the —COOH group to make the photosensitive polymer become soluble in the developer in an non-acid condition and can be released in an acidic condition to make the photosensitive polymer become insoluble or less soluble. In some embodiments, the protected functional group includes at least one tertiary carbon atom which tends to be released under an acidic condition. In some embodiments, the protected functional group includes substituted or nonsubsituted $C_4$-$C_{20}$ alkyl groups, $C_4$-$C_{20}$ cycloalkyl groups.

In some embodiments, the photosensitive polymer further includes solubility-adjusting functional groups bonding to the main chain of the photosensitive polymer. In some embodiments, the solubility-adjusting functional groups are hydrophilic functional groups. In some embodiments, the solubility-adjusting functional groups include lactone moiety. The amounts of solubility-adjusting functional groups bonding to the main chain of the photosensitive polymer may be adjusted according to its application. For example, the solubility and/or dissolution rate of the photosensitive polymer in the developer may be reduced when the amount of solubility-adjusting functional groups in the photosensitive polymers are increased.

Besides the photosensitive polymers, the resist material which may be used to form the resist layer 106 further includes contrast promoters in accordance with some embodiments. The contrast promoters are configured to help the resist material to have a better contrast between the exposed portions and unexposed portions of the resist layer after a developing process is performed. In some embodiments, the contrast promoters act as cross-linkers in the exposed portions of the resist layer.

In some embodiments, the contrast promoter includes a core structure and side chain structures bonding to the core structure. In some embodiments, the core structure bonds to more than three side chain structures. In some embodiments, the core structure bonds to four side chain structures. An end of each side chain structure may have a functional group which tends to bond to the deprotected functional groups of the photosensitive polymers to help the photosensitive polymer to become less soluble (Details will be described later).

The core structure may include polymer structure substituted with functional groups which tend to be dissolved in an alcohol. In some embodiments, the core structure includes polyacrylate. In some embodiments, the core structure is polymethylmethacrylate (PMMA). In some embodiments, each side chain structure includes $C_1$-$C_{20}$ alkyl group, $C_1$-$C_{20}$ alkenyl group, or $C_1$-$C_{20}$ alkynyl group. In some embodiments, each side chain structure includes $C_1$-$C_{10}$ alkyl group, $C_1$-$C_{10}$ alkenyl group, or $C_1$-$C_{10}$ alkynyl group. The contrast promoters with the side chain structures having relatively shorter chain length may have a smaller size and therefore the amount of contrast promoter added to the resist material may be increased. In some embodiments, each side chain structure includes $C_{10}$-$C_{20}$ alkyl group, $C_{10}$-$C_{20}$ alkenyl group, or $C_{10}$-$C_{20}$ alkynyl group. The contrast promoters with the side chain structures having relatively longer chain length may have a smaller steric hindrance when reacting with the photosensitive polymers.

In some embodiments, each side chain structure includes $C_1$-$C_{20}$ alkyl group, $C_1$-$C_{20}$ alkenyl group, or $C_1$-$C_{20}$ alkynyl group with substituent with an functional group at an end of its chain. The function group may interact with the photosensitive polymers in the resist material. In addition, the functional groups on each side chain structure of the contrast promoter may be the same or different. In some embodiments, the resist material includes contrast promoters with various functional groups which can interact (e.g. bond to) the deprotected functional groups (e.g. —COOH groups) of the exposed resist material. In some embodiments, the functional group at the ends of the side chain structures include an alkoxy group, a hydroxyl group, an amine group, a thiol group, a carboxyl group, an ester group, an epoxy group, an aziridine group, a halogen group, an amide group, or an anhydride group.

In some embodiments, the resist material used to form the resist layer 106 further includes a photoacid generator (PAG), a quencher, and a solvent. After the exposure process 108 is performed, the photoacid generators in the resist layer 106 are configured to create an acidic environment in the exposed portions 114 to help the protected functional group to be deprotected.

In some embodiments, the resist material includes photosensitive polymers, contrast promoters, photoacid generators, quenchers, and solvent. In some embodiments, the concentration of the photosensitive polymers in the resist material is in a range from about 1 wt % to about 30 wt %. In some embodiments, the ratio of the contrast promoters to the photosensitive polymers in the resist material is in a range from about 3wt % to about 10 wt %. The amount of the contrast promoters in the resist material should be great enough to improve the pattern contrast of the resulting resist layer but not to be too great or the result of the lithography process may be undermined.

In some embodiments, the solubility and/or dissolution rate of the photosensitive polymer having the protected functional group is greater than the solubility and/or exposed dissolution rate of the photosensitive polymer having the deprotected functional group. In some embodiments, the solubility and/or dissolution rate of the photosensitive polymer having the deprotected functional group is greater than the solubility and/or exposed dissolution rate of the photosensitive polymer having the contrast promoter hydrogen bonding to the deprotected functional group. Therefore, by adding the contrast promoters in the resist material, the contrast between the exposed portions and unexposed portions in a resist layer may be improved.

Figure 2:
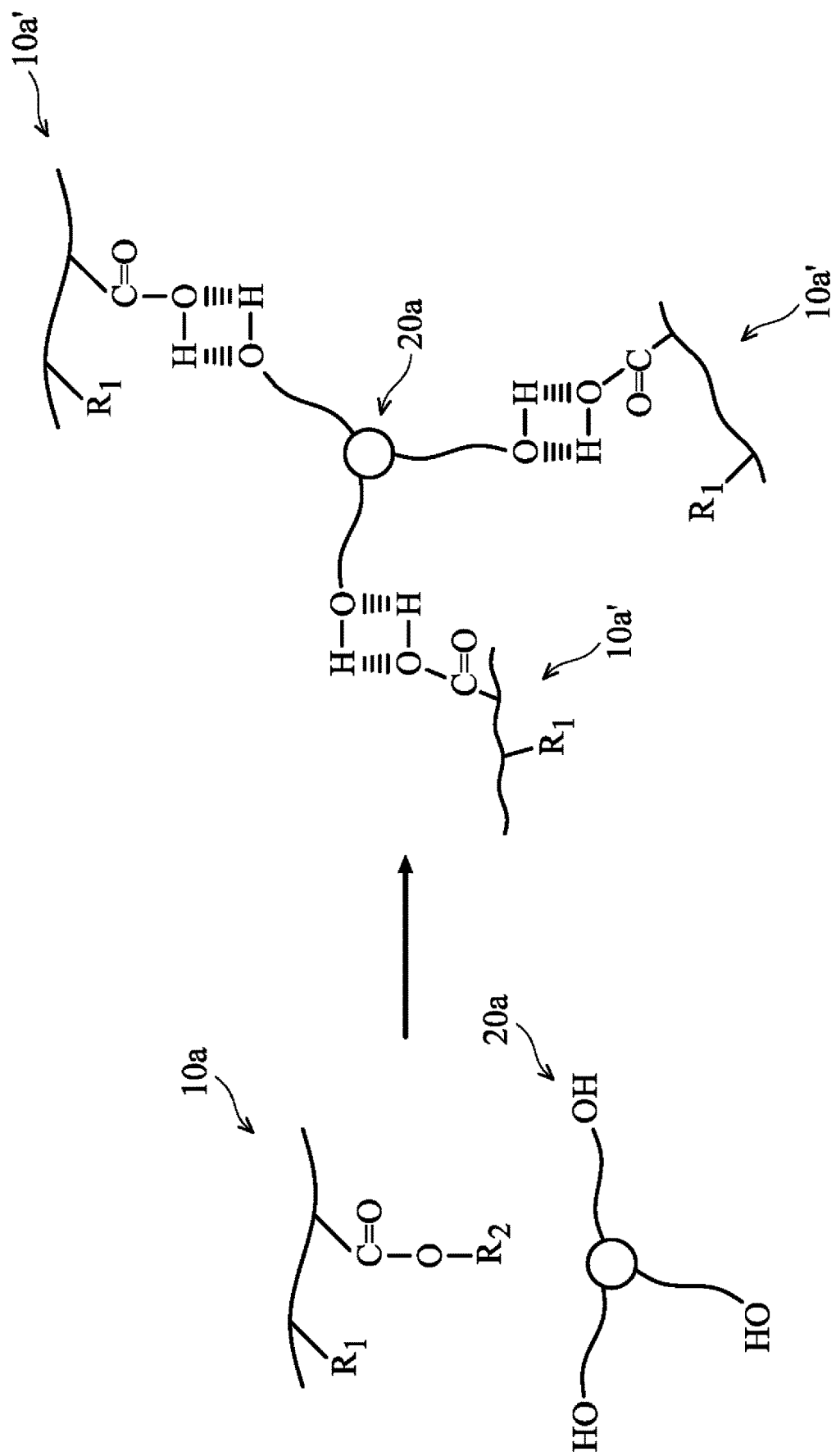
FIG. 2 is a schematic diagram that shows a reaction occurring in a resist layer when an exposure process is performed in a lithography process in accordance with some embodiments.

FIG. 2 is a schematic diagram that shows a reaction occurring in a resist layer when an exposure process is performed in a lithography process in accordance with some embodiments. The lithography process, including the resist layer and the exposure process described herein, may be the same as, or similar to, those shown in FIG. 1A to 1E and described above and some details are not repeated herein.

As shown in FIG. 2, the resist material includes a photosensitive polymer 10a and a contrast promoter 20a. More specifically, the photosensitive polymer 10a includes a photosensitive functional group $R_1$ and a protected functional group —$COOR_2$ in accordance with some embodiments. In some embodiments, $R_1$ is —$C_6H_4OH$. $R_2$ can be seen as a protection group for —COOH which tends to be released in an acidic environment. In some embodiments, $R_2$ is a moiety of one of the following compounds:

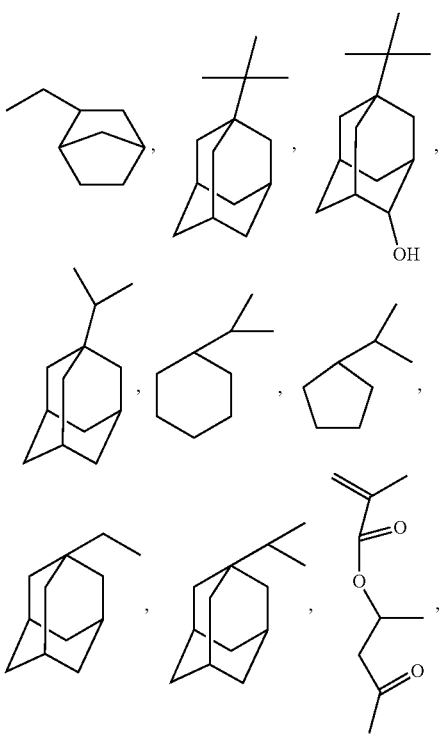

or the like. In some embodiments, the —COO— group bonds to a tertiary carbon atom in the compounds described above. In some embodiments, $R_2$ is

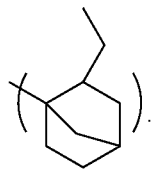

Similar to those described above, the photosensitive polymer 10a is soluble in a developer (e.g. the developer used in the developing process 118) but become less soluble or insoluble after being exposed to radiation (e.g. performing the exposure process 108).

In addition, the contrast promoter 20a includes a core structure and three side chain structures bonding to the core structure. An end of the side chain structure has a functional group —OH which tends to form hydrogen bonding with the —COOH group. The contrast promoter 20a should also be soluble in the developer but it can help the exposed photosensitive polymer become less soluble or become insoluble.

More specifically, when an exposure process (e.g. the exposure process 108) is performed, the photosensitive functional group $R_1$ may release electrons to photoacid generators in the resist material to form an acidic environment. In the acidic condition, the protected functional group —COOR$_2$ tends to be deprotected and the photosensitive polymer 10a is converted to an exposed photosensitive polymer 10a'. More specifically, the protected functional group —COOR$_2$ is deprotected by releasing —R$_2$ and forming the deprotected functional group —COOH. As described previously, as protected functional group —COOR$_2$ is converted to the deprotected functional group —COOH, the exposed photosensitive polymer 10a' becomes less soluble or becomes insoluble in the developer.

Next, the contrast promoter 20a will bond to the deprotected functional group —COOH of the exposed photosensitive polymer 10a' in accordance with some embodiments. In some embodiments, the contrast promoter 20a bonds to the deprotected functional group of the exposed photosensitive polymer 10a' through hydrogen bonding.

Although the exposed photosensitive polymer 10a' can become less soluble in the developer after the resist material is exposed, some portions of the exposed portions (e.g. the exposed portions 114) of the resist layer (e.g. the resist layer 106) may still be removed (e.g. dissolved in the developer). Therefore, contrast promoter 20a is added in the resist material to react (e.g. bond) with the deprotected functional group of the exposed photosensitive polymer 10a', so that the exposed photosensitive polymer 10a' can be even less soluble and therefore the loss of the exposed photosensitive polymer 10a' can be reduced.

Furthermore, as described previously, the contrast promoter 20a may include several side chains and each side chain includes the functional group that is able to bond with the deprotected functional group of the exposed photosensitive polymer. That is, the contrast promoter 20a may act as a cross-linker in the exposed portions of a resist layer. As shown in FIG. 2, a crosslinking structure is formed by bonding a number of the exposed photosensitive polymers 10a' together. In some embodiments, each side chain of the contrast promoter 20a bonds to one deprotected functional group of the exposed photosensitive polymer 10a'. By forming the crosslinking structure, the solubility/dissolution rate of the exposed photosensitive polymer 10a' may be reduced further.

It should be noted that, although one contrast promoter 20a shown in FIG. 2 is bonded to three exposed photosensitive polymers 10a', the numbers and the position of them are shown for better understanding the concept of the disclosure but the scope of the disclosure is not intended to be limiting.

Figure 3:
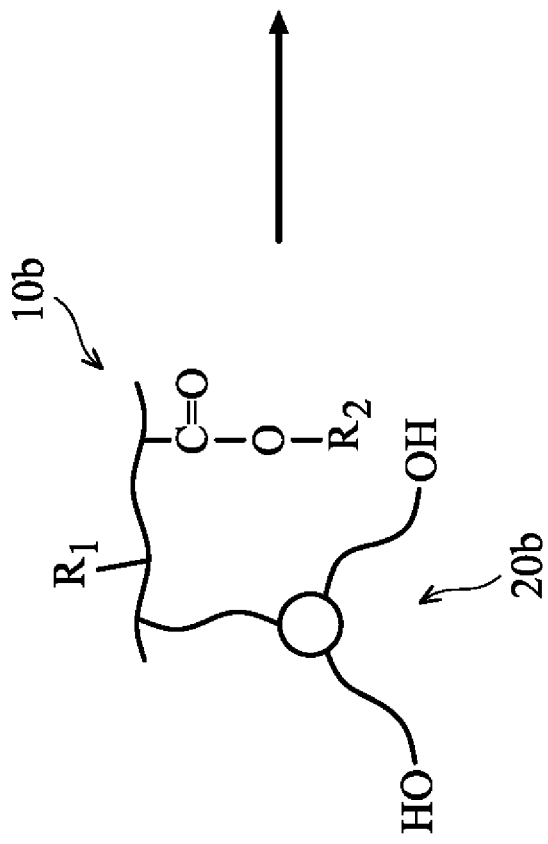
FIG. 3 is a schematic diagram that shows a reaction occuring in a resist layer when an exposure process is performed in a lithography process in accordance with some embodiments.
Figure 3:
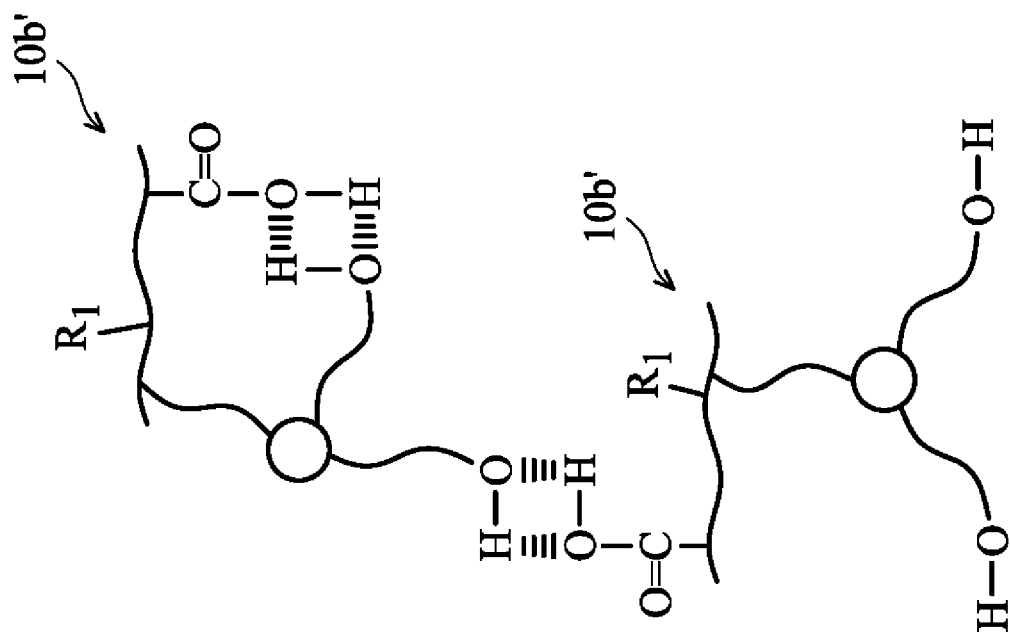

FIG. 3 is a schematic diagram that shows a reaction occurring in a resist layer when an exposure process is performed in a lithography process in accordance with some embodiments. The reaction shown in FIG. 3 may be similar to that shown in FIG. 2, except a contrast promoter 20b is bonded to the main chain of a photosensitive polymer 10b. The lithography process, including the resist layer and the exposure process described herein, may be the same as, or similar to, those shown in FIG. 1A to 1E and described above.

More specifically, the photosensitive polymer 10b also includes the photosensitive functional group $R_1$ and the protected functional group —COOR$_2$ in accordance with some embodiments. In addition, the contrast promoter 20b includes a core structure and three side chain structures bonding to the core structure, and the ends of at least two side chain structures have functional groups which tend to form hydrogen bonding with the —COOH group.

In addition, the contrast promoter 20b is bonded to the main chain of the photosensitive polymer 10b, as shown in FIG. 3 in accordance with some embodiments. That is, the contrast promoter 20b and the photosensitive polymer 10b may be in the same compound. Furthermore, the compound including the contrast promoter 20b and the photosensitive polymer 10b should still be soluble in the developer when the resist layer is not exposed to radiation but will become less soluble after the resist layer is exposed to radiation.

In addition, it should be noted that, although the contrast promoter 20b shown in FIG. 3 is bonded to the photosensitive polymer 10b through one side chain, it can alternatively be bonded to the photosensitive polymer through the core structure in accordance with some other embodiments.

Similar to the reaction shown in FIG. 2, when an exposure process (e.g. the exposure process 108) is performed, the photosensitive functional group $R_1$ in the exposed portion tends to release electrons to photoacid generators in the resist material to form an acidic environment, and the protected functional group —$COOR_2$ tends to be deprotected to form the exposed photosensitive polymer 10b'.

Next, the contrast promoter 20b will be bond to the deprotected functional group —COOH of the exposed photosensitive polymer 10b' in accordance with some embodiments. In some embodiments, the contrast promoter 20b bonds to the deprotected functional group of the exposed photosensitive polymer 10b' through hydrogen bonding, so that the solubility of the exposed photosensitive polymer 10b' may be reduced further and therefore the loss of the exposed photosensitive polymer 10b' can also be reduced.

Furthermore, as described previously, the contrast promoter 20 may bond to more than one deprotected functional group of several exposed photosensitive polymers. Accordingly, a crosslinking structure may be formed. By forming the crosslinking structure, the solubility of the exposed photosensitive polymer 10b' may be reduced further.

It should be noted that, although two exposed photosensitive polymers 10b' are shown in FIG. 3, the numbers and the position of them are shown for better understanding the concept of the disclosure but the scope of the disclosure is not intended to be limiting. For example, the contrast promoter on the lower exposed photosensitive polymer 10b' shown in FIG. 3 may bond to another exposed photosensitive polymer, although they are not shown in FIG. 5.

Figure 4:
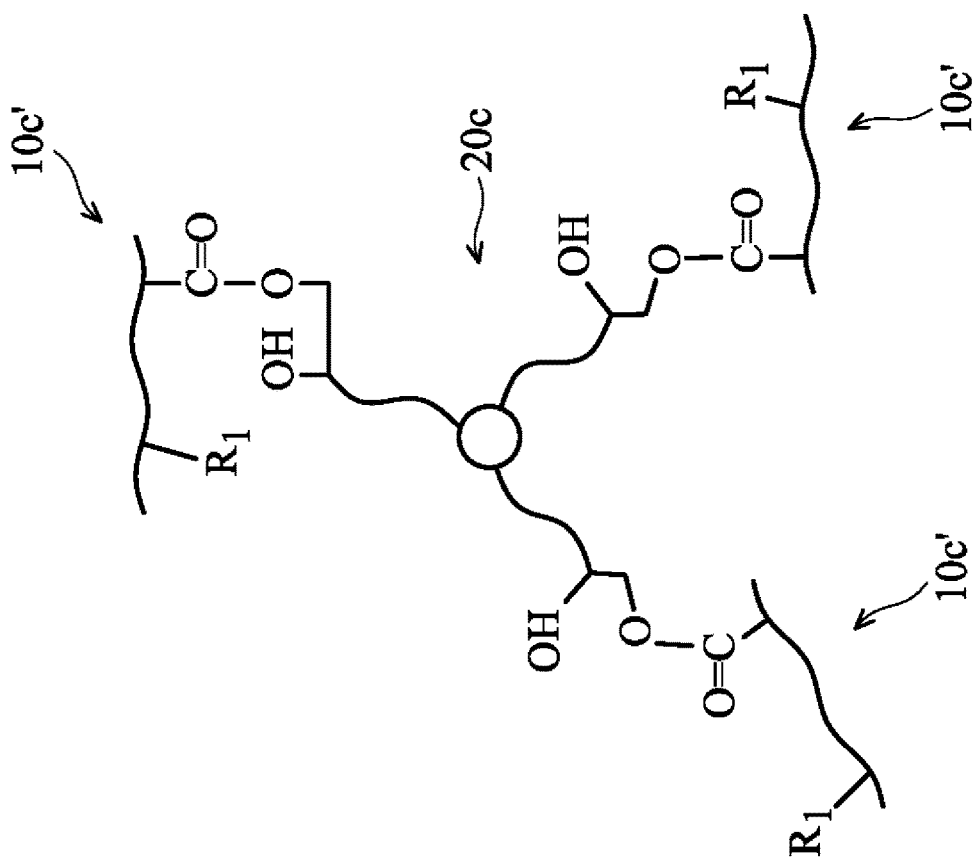
FIG. 4 is a schematic diagram that shows a reaction occuring in a resist layer when an exposure process is performed in a lithography process in accordance with some embodiments.
Figure 4:
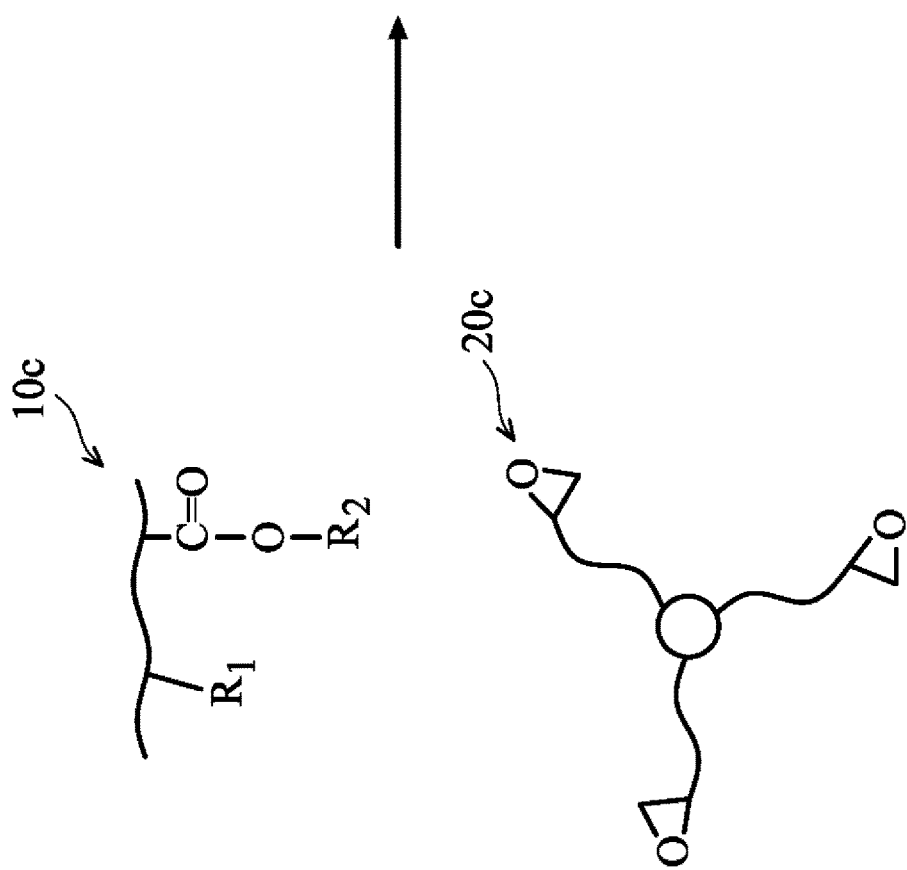

FIG. 4 is a schematic diagram that shows a reaction occuring in a resist layer when an exposure process is performed in a lithography process in accordance with some embodiments. The reaction shown in FIG. 4 may be similar to that shown in FIG. 2, except a contrast promoter 20c is bonded to the main chain of a photosensitive polymer 10c through a chemical bond. The lithography process, including the resist layer and the exposure process described herein, may be the same as, or similar to, those shown in FIG. 1A to 1E and described above.

As shown in FIG. 4, the resist material includes a photosensitive polymer 10c and a contrast promoter 20c. More specifically, the photosensitive polymer 10c includes the photosensitive functional group $R_1$ and the protected functional group —$COOR_2$ in accordance with some embodiments. The contrast promoter 20c includes a core structure and three side chain structures bonding to the core structure. An end of the side chain structure has an epoxy group which tends to form react with the —COOH group. The contrast promoter 20c should also be soluble in the developer but it can help the exposed photosensitive polymer become less soluble or become insoluble.

When an exposure process (e.g. the exposure process 108) is performed, the photosensitive functional group $R_1$ tends to release electrons to photoacid generatoers in the resist material to form an acidic environment, and the protected functional group —$COOR_2$ tends to be deprotected and the photosensitive polymer 10c is converted to an exposed photosensitive polymer 10c'.

Next, the contrast promoter 20c will be bonded to the deprotected functional group —COOH of the exposed photosensitive polymer 10c' in accordance with some embodiments. In some embodiments, the contrast promoter 20c bonds to the deprotected functional group of the exposed photosensitive polymer 10c' through a chemical bond. In some embodiments, the contrast promoter 20c bonds to the deprotected functional group of the exposed photosensitive polymer 10c' through a covalent bond. By bonding the contrast promoter 20c to the deprotected functional group of the exposed photosensitive polymer 10c', the solublity of the exposed photosensitive polymer 10c' in the developer can be reduced and therefore the loss of the exposed photosensitive polymer 10c' can be reduced.

Furthermore, as described previously, the contrast promoter 20c may include several side chains and each side chain includes the functional group that is able to bond with the deprotected functional group of the exposed photosensitive polymer. Accordingly, a crosslinking structure may be formed. In addition, as described above, the contrast promoter 20c and the exposed photosensitive polymers 10c' are bonded through chemical bonds (e.g. covalent bonds). That is, in the exposed portion of the resist layer, the contrast promoter 20c and the exposed photosensitive polymers 10c' may become one single compound with a relatively large size and low solubility in the developer. Therefore, the solubility of the exposed portion of the resist layer can be reduced, and the contrast between the exposed portions and unexposed portions of the resist layer after performing a developing process may be improved.

It should be noted that, although one contrast promoter 20c shown in FIG. 4 is bonded to three exposed photosensitive polymers 10c', the numbers and the position of them are shown for better understanding the concept of the disclosure but the scope of the disclosure is not intended to be limiting.

Figure 5:
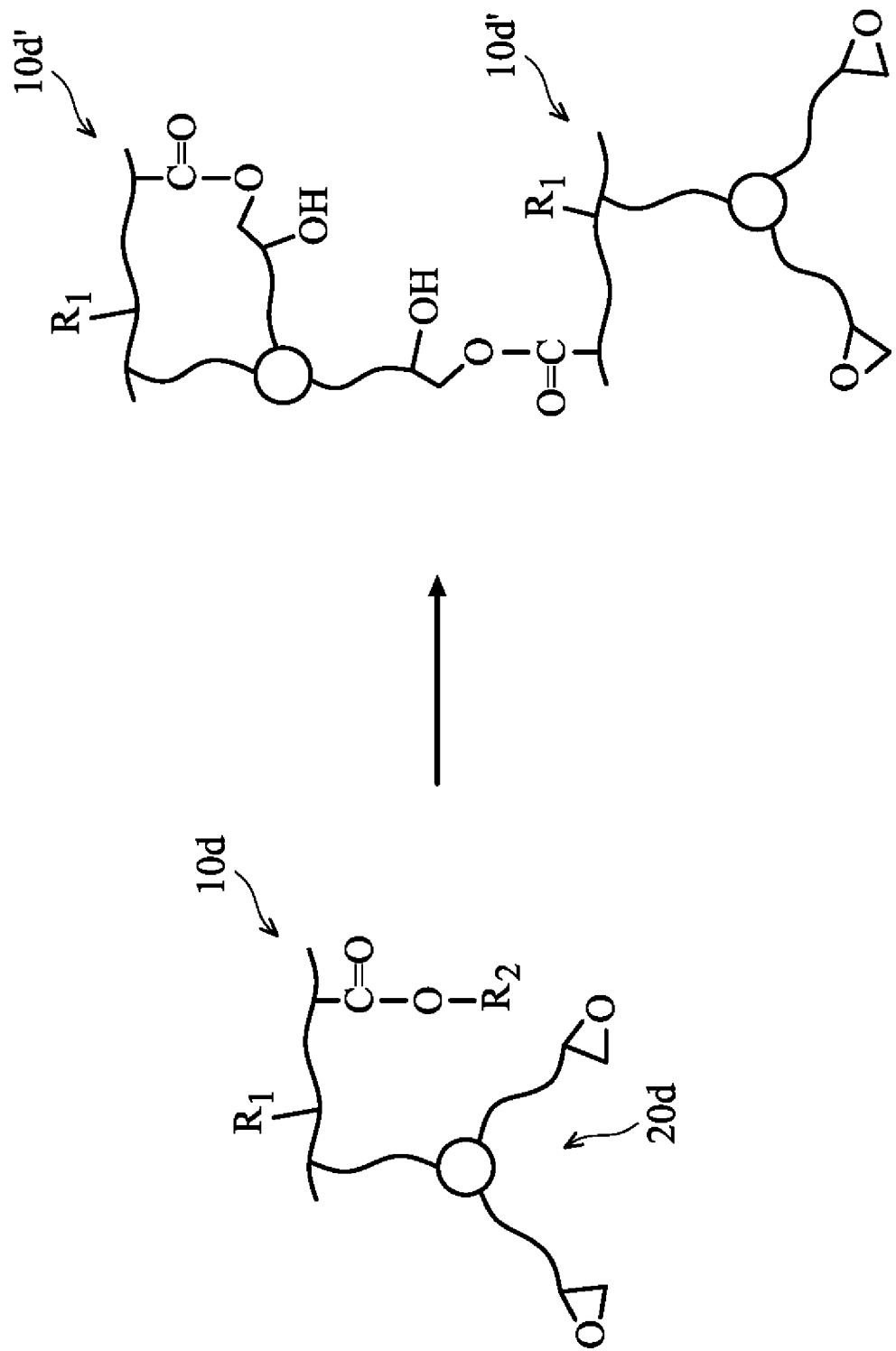
FIG. 5 is a schematic diagram shows a reaction occurs in a resist layer when an exposure process is performed in a lithography process in accordance with some embodiments.

FIG. 5 is a schematic diagram shows a reaction occurs in a resist layer when an exposure process is performed in a lithography process in accordance with some embodiments. The reaction shown in FIG. 5 is similar to that shown in FIG. 4, except a contrast promoter 20d is bonded to the main chain of a photosensitive polymer 10d. The lithography process, including the resist layer and the exposure process described herein, may be the same as, or similar to, those shown in FIG. 1A to 1E and described above and therefore some More specifically, the photosensitive polymer 10d also includes the photosensitive functional group $R_1$ and the protected functional group —$COOR_2$, and the contrast promoter 20d is bonded to the main chain of the photosensitive polymer 10d, as shown in FIG. 5 in accordance with some embodiments. Similarly, the compound including the contrast promoter 20d and the photosensitive polymer 10d should still be soluble in the developer when the resist layer is not exposed to a radiation and but become less soluble after the resist layer is exposed to a radiation. In addition, although the contrast promoter 20d shown in FIG. 5 is bonded to the photosensitive polymer 10d through one side chain, it can alternatively be bonded to the photosensitive polymer through the core structure in accordance with some other embodiments.

Similar to the reaction shown in FIG. 4, when an exposure process (e.g. the exposure process 108) is performed, the protected functional group —$COOR_2$ tends to be deprotected to form the exposed photosensitive polymer 10d'. Next, the contrast promoter 20d will be bond to the deprotected functional group —COOH of the exposed photosensitive polymer 10d' in accordance with some embodiments. In some embodiments, the contrast promoter 20b bonds to the deprotected functional group of the exposed photosensitive polymers 10b' through chemical bonds to form a crosslinking structure. By forming the crosslinking structure, the solubility of the exposed photosensitive polymer 10d' may be further reduced.

It should be noted that, although two exposed photosensitive polymers 10d' are shown in FIG. 5, the numbers and the position of them are shown for better understanding the concept of the disclosure but the scope of the disclosure is not intended to be limiting. For example, the epoxy groups of the contrast promoter on the lower exposed photosensitive polymer 10b' shown in FIG. 5 may bond to other exposed photosensitive polymers, although they are not shown in FIG. 5.

It should be noted that, although FIGS. 2 and 4 show the contrast promoters are additives in the resist material and FIGS. 3 and 5 show the contrast promoters are bonded to the photosensitive polymers, they are merely examples for better understanding the concept of the disclosure but the scope of the disclosure is not intended to be limiting. In some embodiments, the contrast promoters are bonded to photoacid generators in the resist material. In some embodiments, the contrast promoters are bonded to quenchers in the resist material.

Generally, photosensitive polymers are used in a resist material in a lithography process to form a resist layer. In an EUV lithography process, the amount of the photosensitive functional groups in the photosensitive polymers may be increase to obtain a better light sensitivity. However, when the amount of the photosensitive functional groups increases, improving the contrast between the exposed portions and unexposed portion of the resist layer may become challenging. Therefore, contrast promoters (e.g. the contrast promoters 20a to 20d) are added in the resist material to help the contrast between the exposed portions and unexposed portion of the resist layer to be improved.

As described previously, after some portions of the resist layer is exposed, the solubility and/or the dissolution rate of the photosensitive polymers in the exposed portions will be reduced. In addition, the functional groups on the contrast promoters will interact with (e.g. bond to) the exposed photosensitive polymer so that the solubility and/or the dissolution rate of the exposed photosensitive polymers will be reduced further. Accordingly, the contrast between the exposed portions and unexposed portions of the resist layer may be improved.

Embodiments of a resist material and methods for forming semiconductor structure including using the resist material are provided. The resist material may be used to form a resist layer in a lithography process and may include a photosensitive polymer and a contrast promoter. The photosensitive polymer may include a protected functional group which tends to be deprotected after being exposed. In addition, the contrast promoter tend to bond to the deprotected functional group of exposed photosensitive polymer, so that the contrast between the exposed portion and the unexposed portion of the resist layer may be improved.

In some embodiments, a method for forming a semiconductor structure is provided. The method for forming a semiconductor structure includes forming a resist layer over a substrate and exposing a portion of the resist layer to form an exposed portion of the resist layer by performing an exposure process. The method for forming a semiconductor structure further includes developing the resist layer in a developer. In addition, the resist layer is made of a resist material including a photosensitive polymer and a contrast promoter, and a protected functional group of the photosensitive polymer is deprotected to form a deprotected functional group during the exposure process, and a functional group of the contrast promoter bonds to the deprotected functional group of the photosensitive polymer.

In some embodiments, a method for forming a semiconductor structure is provided. The method for forming a semiconductor structure includes forming a resist layer over a substrate and the resist layer is made of a resist material. The resist material includes photosensitive polymers having protected functional groups and contrast promoters having a core structure and a plurality of side chain structures. The method for forming a semiconductor structure further includes exposing a first portion of the resist layer by performing an exposure process. In addition, the protected functional groups in the first portion of the resist layer are converted to deprotected functional groups, and functional groups on the side chain structures of the contrast promoters in the first portion of the resist layer react with the deprotected functional groups of the photosensitive polymers to form a cross-linking structure. The method for forming a semiconductor structure further includes developing the resist layer in a developer.

In some embodiments, a resist material used in a lithography process is provided. The resist material used in a lithography process includes a photosensitive polymer having acid labile functional groups and the acid labile functional groups are configured to convert to acid groups in an acidic condition. The resist material used in a lithography process further includes a contrast promoter comprises a core structure and a plurality of side chain structures bonding to the core structure, wherein a functional group at an end of each side chain structure of the contrast promoter is configured to interact with the acid group of the photosensitive polymer in an acidic condition.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
   forming a resist layer over a substrate;
   exposing a portion of the resist layer to form an exposed portion of the resist layer by performing an exposure process; and
   developing the resist layer in a developer,
   wherein the resist layer is made of a resist material comprising a photosensitive polymer, and
   wherein a protected functional group and a crosslinking contrast promoter are both covalently bonded to a main chain of the photosensitive polymer before the exposure process is performed, and
   the protected functional group of the photosensitive polymer is deprotected to form a deprotected functional group during the exposure process, and a functional group of the crosslinking contrast promoter bonds to the deprotected functional group of the photosensitive polymer, wherein the protected functional group is different from the functional group of the crosslinking contrast promoter, and the functional group of the crosslinking contrast promoter is bonded to the main chain of the photosensitive polymer through a $C_{10}$-$C_{20}$ alkenyl group or a $C_{10}$-$C_{20}$ alkynyl group.

2. The method for forming a semiconductor structure as claimed in claim 1, wherein an unexposed portion of the resist layer dissolves in the developer.

3. The method for forming a semiconductor structure as claimed in claim 1, wherein the functional group of the crosslinking contrast promoter bonds to the deprotected functional group of the photosensitive polymer through a hydrogen bond.

4. The method for forming a semiconductor structure as claimed in claim 1, further comprising:
heating the resist layer after the exposure process is performed,
wherein the functional group of the crosslinking contrast promoter reacts with the deprotected functional group of the photosensitive polymer when the resist layer is heated.

5. The method for forming a semiconductor structure as claimed in claim 1, wherein the deprotected functional group of the photosensitive polymer is a —COOH group and the functional group of the crosslinking contrast promoter is an alkoxy group, a hydroxyl group, an amine group, a thiol group, a carboxyl group, an ester group, an epoxy group, an aziridine group, a halogen group, an amide group, or an anhydride group.

6. The method for forming a semiconductor structure as claimed in claim 1, further comprising:
forming a material layer over the substrate before the resist layer is formed; and
etching the material layer through the resist layer after developing the resist layer.

7. The method for forming a semiconductor structure as claimed in claim 6, wherein the developer is a negative tone developer.

8. The method for forming a semiconductor structure as claimed in claim 1, wherein the protected functional group includes substituted or nonsubstituted $C_4$-$C_{20}$ alkyl groups or $C_4$-$C_{20}$ cycloalkyl groups.

9. The method for forming a semiconductor structure as claimed in claim 1, wherein the crosslinking contrast promoter comprises a core structure, and the functional group is bonded to the core structure through the $C_{10}$-$C_{20}$ alkenyl group or $C_{10}$-$C_{20}$ alkynyl group.

10. The method for forming a semiconductor structure as claimed in claim 9, wherein the functional group of the crosslinking contrast promoter is an amine group, a thiol group, a carboxyl group, an aziridine group, or a halogen group.

11. The method for forming a semiconductor structure as claimed in claim 9, wherein the functional group of the crosslinking contrast promoter is an aziridine group.

12. A method for forming a semiconductor structure, comprising:
forming a resist layer over a substrate, wherein the resist layer is made of a resist material comprising:
a photosensitive polymer having a main chain and protected functional groups bound to the main chain; and
a crosslinking contrast promoter having a core structure and a first side chain structure and a second side chain structure bound to the core structure,
exposing a first portion of the resist layer by performing an exposure process, wherein the protected functional groups in the first portion of the resist layer are converted to deprotected functional groups, and a functional group on the second side chain structure of the crosslinking contrast promoter in the first portion of the resist layer reacts with the deprotected functional groups of the photosensitive polymer to form a crosslinking structure; and
developing the resist layer in a developer,
wherein the protected functional groups are different from the crosslinking contrast promoter, and the first side chain structure is covalently bound to the main chain of the photosensitive polymer before the exposure process is performed, and
wherein the second side chain structure comprises $C_{10}$-$C_{20}$ alkenyl group or $C_{10}$-$C_{20}$ alkynyl group, and the functional group at the end of the second side chain structure of the crosslinking contrast promoter is an alkoxy group, a hydroxyl group, an amine group, a thiol group, a carboxyl group, an ester group, an epoxy group, an aziridine group, a halogen group, an amide group, or an anhydride group.

13. The method for forming a semiconductor structure as claimed in claim 12, wherein the functional group on the second side chain structure of the crosslinking contrast promoter cross-links to the deprotected functional groups of the photosensitive polymer through hydrogen bonds or chemical bonds.

14. The method for forming a semiconductor structure as claimed in claim 12, wherein a second portion of the resist layer is not exposed in the exposure process, and the crosslinking contrast promoter and the photosensitive polymer in the second portion of the resist layer are soluble in the developer.

15. The method for forming a semiconductor structure as claimed in claim 12, wherein the photosensitive polymer further comprises photosensitive functional groups and hydrophilic functional groups.

16. The method for forming a semiconductor structure as claimed in claim 12, wherein a dissolution rate of the photosensitive polymer having the deprotected functional groups is greater than a dissolution rate of the photosensitive polymer bonding to the crosslinking contrast promoter.

17. A resist material used in a lithography process, comprising:
a photosensitive polymer having acid labile functional groups, wherein the acid labile functional groups are configured to convert to acid groups in an acidic condition; and
a crosslinking contrast promoter comprises a core structure and a first side chain structure and a second side chain structure bound to the core structure, wherein the first side chain structure is bonded to a main chain of the photosensitive polymer and a functional group at an end of the second side chain structure of the crosslinking contrast promoter is configured to interact with the acid group of the photosensitive polymer in an acidic condition,
wherein the second side chain structure comprises $C_{10}$-$C_{20}$ alkenyl group or $C_{10}$-$C_{20}$ alkynyl group, and the functional group at the end of the second side chain structure of the crosslinking contrast promoter is an alkoxy group, a hydroxyl group, an amine group, a thiol group, a carboxyl group, an ester group, an epoxy group, an aziridine group, a halogen group, an amide group, or an anhydride group.

18. The resist material used in a lithography process as claimed in claim 17, wherein the photosensitive polymer further has a photosensitive functional group and a hydrophilic functional group.

19. The resist material used in a lithography process as claimed in claim 17, wherein the resist material is a positive tone photoresist material which is configured to be used with a negative tone developer in an Extreme ultraviolet (EUV) lithography.

20. The resist material used in a lithography process as claimed in claim 17, wherein the functional group at the end of the second side chain structure of the crosslinking contrast promoter is a halogen group.

* * * * *